DIFFUSION PROCESS

Filed April 25, 1966 2 Sheets-Sheet 1

INVENTORS
MICHAEL C. DUFFY
DAVID P. KENNEDY
PHILIP C. MURLEY
WILLIAM J. ARMSTRONG
JACK J. SEABOLDT

BY George O. Saile
ATTORNEY

United States Patent Office 3,490,962
Patented Jan. 20, 1970

3,490,962
DIFFUSION PROCESS

Michael C. Duffy, Poughkeepsie, David P. Kennedy, Wappingers Falls, and Philip C. Murley, Poughkeepsie, N.Y., William J. Armstrong, Essex Junction, Vt., and Jack Jay Seaboldt, Fishkill, N.Y., assignors to International Business Machines Corporation, Armonk, N.Y., a corporation of New York Filed Apr. 25, 1966, Ser. No. 544,994
Int. Cl. H01l 7/44
U.S. Cl. 148—187 10 Claims

ABSTRACT OF THE DISCLOSURE

A method of forming a high speed transistor by providing a mask on the surface of a semiconductor, the mask having an opening of a width less than 4.45 multiples of an atom diffusion length of a given impurity of one conductivity type, exposing the surface through the opening to an atmosphere containing the given impurity to form a highly doped surface region, heating the substrate in an atmosphere having a lesser concentration of the given impurity to form a collector-base junction and forming by diffusion through the same opening an emitter-base junction.

This invention relates to the fabrication of diffused semiconductor devices and more particularly to a method for controlling the diffused junction depth and the impurity surface concentration in semiconductor devices.

The design of modern high speed switching transistors has established a need of reducing junction size and simultaneously decreasing the emitter junction penetration depth. Fabrication of these devices is becoming increasingly more difficult. The requirement of a shallow emitter junction, in conjunction with a large impurity atom surface concentration, makes it difficult to attain a satisfactory compromise between the diffusion time and the diffusion temperature. Because this problem is presently encountered in the fabrication of junction transistors, it represents a fundamental limitation in the design of higher speed devices with even more shallow emitter requirements.

Further, in the fabrication of diffused semiconductor devices, using the presently available diffusion methods, an approximately constant impurity atom surface concentration is obtained across the semiconductor surface subject to the diffusion. These present day methods offer no opportunity to obtain different values for surface concentration at different locations on the exposed semiconductor surface.

In the manufacture of semiconductor devices it is common to form a plurality of openings in a masking layer over a semiconductor surface and then diffuse impurities through these openings to form a plurality of PN junctions. The resulting product of this type of diffusion is a plurality of devices of the identical characteristics. Should it be desired to form devices in the semiconductor layer having different characteristics it would be necessary to form new holes in the masking film and rediffuse impurities under different conditions of temperature and/or time.

It is an object of this invention to provide a new method for diffusing impurities into the surface of a semiconductor.

It is an object of this invention to provide a method for forming a PN junction that produces a high speed transistor.

It is another object of this invention to provide a method for forming high speed transistors in a semiconductor layer wherein the junction depth is controlled.

It is a further object of this invention to provide a method for simultaneously forming more than one type of circuit device in a semiconductor layer by a single two step diffusion process.

It is another object of this invention to simultaneously form shallow and deep transistors in a semiconductor layer using basically two two-step diffusion processes.

It is another object of this invention to form resistors with different sheet resistances (ohms/sq.) from a single two step diffusion.

These and other objects are accomplished in accordance with the broad aspects of the present invention by control of the width of the mask opening used in the diffusion process. The critical mask opening for the process has been determined to be less than about 5.6 multiples of an atom diffusion length of the conductivity type determining impurity in contact with the surface of the semiconductor layer. The mask is composed of any appropriate material which will keep the impurity from diffusing into the portions of the semiconductor layer which are desired to remain pure. The semiconductor layer in the areas of openings in the mask is exposed for the desired time and temperature to the environment containing the desired conductivity type determining impurity. Following this initial diffusion the layer containing the impurity is subjected to a second internal diffusion. The second diffusion step diffuses the impurity within the semiconductor layer from the surface deeper into the layer. The effect of this second diffusion is to cause a nonuniform impurity surface concentration for areas in the semiconductor where the mask opening was less than the 4.45 multiple and to control the junction depth.

Several different types of circuit devices can be simultaneously formed in a semiconductor layer using mask openings of various widths because the result of the second step of the diffusion process yields different values of surface concentration for each mask opening having a width of less than about 5.6 multiples of the impurity atom diffusion length. For example, a presently known type of semiconductor transistor device could be produced in the semiconductor layer by using a mask opening of greater than 4.45 multiples of an impurity atom diffusion length. In addition, a series of devices such as resistors and high speed transistors having different electrical characteristics could be formed in the semiconductor at mask opening areas having widths of less than about 4.45 multiples. This diffusion method reduces the number of steps required to produce an integrated circuit having different type devices, such as transistors of different speed and resistors of different values, formed in a semiconductor layer.

The foregoing and other objects, features and advantages of the present invention will be apparent from the following more particular description of the preferred embodiments of the invention as illustrated in the accompanying drawings:

In the dawings:

Figure 1:
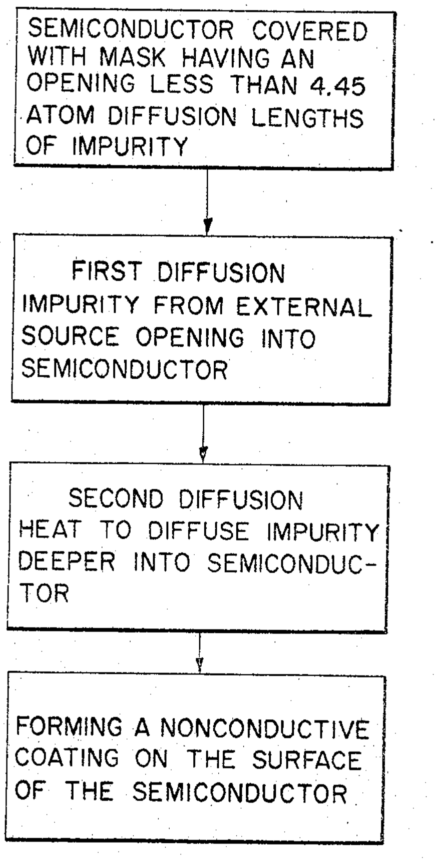
FIGURE 1 is a flow diagram illustrating a preferred process of the present invention.
Figures 2, 3:
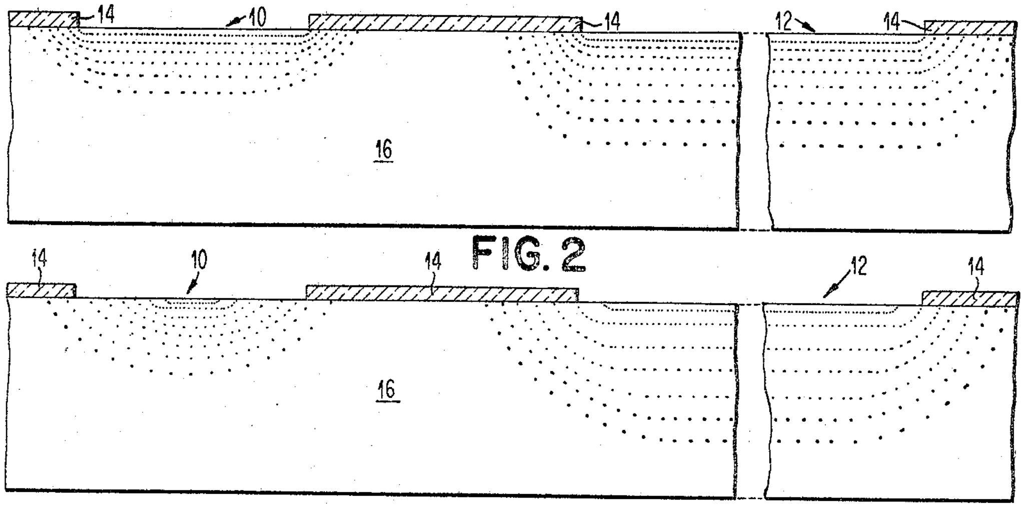
FIGURE 2 is a greatly enlarged, schematic illustration showing the diffused impurity concentration in a semiconductor layer after the first diffusion step.
FIGURE 3 is a greatly enlarged schematic illustration showing the impurity concentration in the semiconductor layer after the second diffusion step.

The method of the present invention may be illustrated by reference to FIGURES 1, 2 and 3. As the flow diagram of FIGURE 1 indicates, the semiconductor layer is covered with a mask having an opening less than about 4.45 at diffusion lengths of the impurity to be diffused into the semiconductor. The mask may be applied by any conventional techniques, however, it is preferred that the mask be composed of silicon dioxide where silicon is the semiconductor being used. The layer of silicon dioxide can readily be oxidized in steam at an elevated temperature to give a silicon dioxide thickness of, for example, 5000 angstrom units. Holes can then be opened in the silicon dioxide layer for the subsequent diffusion step by use of conventional photoresist and chemical etching techniques. The holes 10 and 12 in mask 14 illustrated in schematic illustrations FIGURES 2 and 3 are, respectively, less than about 4.45 atom diffusion lengths and greater than 5.6 atom diffusion lengths. The desired impurity is then diffused into the semiconductor 16 at the openings 10 and 12 in the mask from an external source. One method for diffusing the conductivity type determining impurity into the semiconductor is by means of gaseous diffusion. In this method the semiconductor layer having a mask with appropriate openings thereon is inserted in a capsule containing the impurity to be diffused into the semiconductor in its vapor state. The semiconductor layer is maintained in the capsule with the constant vapor source of impurity for the desired time and at the appropriate temperature to produce the desired concentration of impurities in the semiconductor.

When the impurities diffuse into the semiconductor material, the distribution of the impurity is such that there is a large concentration of the impurity at the surface and progressively lesser quantities at greater distances within the material as schematically shown in FIGURE 2 by means of the dot shading. The surface concentration is substantially identical in the semiconductor in the area of both openings 10 and 12. The second diffusion step is accomplished in an environment which contains a concentration of impurity lower than that necessary to produce the impurity concentration already present in the semiconductor at the surface of the semiconductor. The second diffusion step results in an increased depth of diffusion and, in the case of an opening of less than about 4.45 multiples of the atom diffusion length of the impurity, results in a nonuniform impurity surface concentration on that portion of the layer initially exposed to the impurity through the mask openings as shown in FIGURE 3. The speed of diffusion, of course, is dependent upon the temperature, and the concentration of the impurity. The diffusion operation can be performed in the least time where high temperatures and high concentration of impurity in the environment are used. Further details for the basic two step diffusion used in the process of the present invention can be obtained from U.S. Patent 2,981,645 dated Apr. 25, 1961, and assigned to the same assignee as the present invention.

It has been discovered that when the mask opening is reduced to less than about 4.45 multiples of the atom diffusion lengths of the conductivity type determining impurity that the diffusion is no longer an elementary one-dimensional diffusion process, but, instead, this impurity distribution is dependent upon the width of the diffusion mask opening and is not a constant. It is theorized that this effect of variation of diffusion depth with the mask opening and the nonuniform impurity concentration on the surface of the semiconductor after the second diffusion step result because a large percentage of the doping impurity diffuses parallel to the surface under the oxide rather than normal to the surface.

High speed switching transistors can be formed by the present method. It has been established that high speed switching transistors need shallow junction depths in conjunction with a large impurity atom surface concentration. High speed transistors are normally made with shallow junctions. The reason for this is that the speed of a device is limited by transport of carriers across the base region. Narrow base width devices, without being punch-through limited, can be obtained with shallow structures due to the higher base doping of shallow devices. Another reason for making high speed transistors closer to the surface is that the emitter impurity concentration gradient at the emitter base junction is steeper with shallow devices. This reduces the neutral capacitance of the emitter which also limits the speed of a device.

Figure 4:
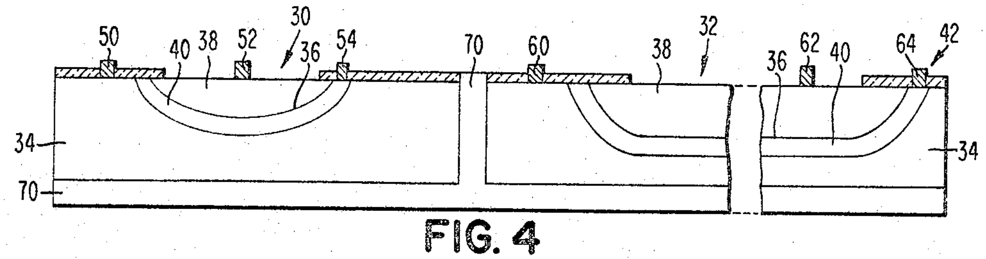
FIGURE 4 is a schematic illustration of two transistors simultaneously made according to the method of the present invention where the transistors have different speed characteristics.

The dependency of impurity distribution on the opening in the mask below the 4.45 multiple allows for the production of more than one type of circuit device in a semiconductor layer simultaneously. FIGURE 4 shows, for example, two transistors 30 and 32 having different speed characteristics in a semiconductor layer of silicon 34. The method of the invention is used as described in the above description relating to FIGURES 1, 2 and 3 to obtain the diffused layers in FIGURE 3. Transistors are now formed by diffusing an opposite type impurity into the areas with previously formed base layer 40. The second diffusion of impurities into the wafer is precisely controlled as to repetitivity and extended by conventional techniques, so that there is thereby formed a junction 36 between an emitter layer 38 and the base layer 40. Openings are then made through the silicon dioxide coating 42 to allow for the provision of an ohmic contact to the collector at the upper surface of the semiconductor. Other holes through the mask 42 are made to open the base layer 40 and the emitter 38, if necessary, to allow for external connections. Ohmic contacts 50, 52, 54, 60, 62 and 64 are then applied in a conventional manner or according to the method disclosed in patent application Ser. No. 474,074 filed July 22, 1965 (IBM Docket 14,129) to the separate elements of the transistor through the openings. An insulating region 70 is shown surrounding the two transistors. This insulating region may be a dielectric material or a region which has been doped with an impurity so that the region is opposite in character to the remainder of the silicon semiconductor layer 34. The difference in speed of the transistors 30 and 32 is characterized by the initial diffusion process of FIGURES 1, 2 and 3 based upon the critical width of the mask opening in layer 42.

Figure 5:
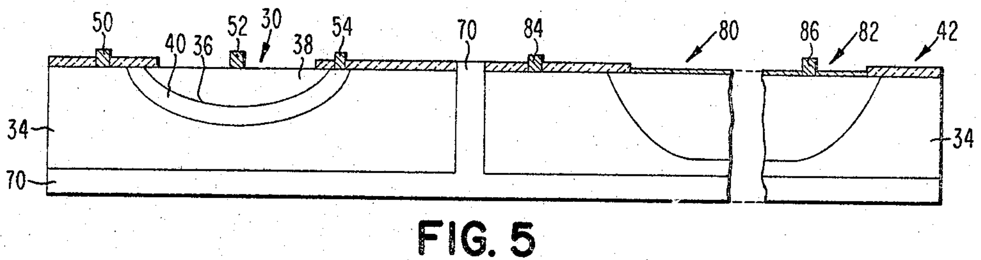
FIGURE 5 is a schematic illustration showing a high speed transistor and a resistor simultaneously made according to the present invention.

FIGURE 5 illustrates in a similar manner how a transistor 30 and a resistor 80 can be formed in a semiconductor layer 34. The first part of the procedure for simultaneously forming a transistor and a resistor in a layer 34 of silicon involves the basic principles described in relation to FIGURES 1, 2 and 3. The second diffusing step, however, is preferably done in an oxidizing atmosphere so that the exposed surface of the semiconductor, where a silicon wafer is used, is oxidized to a silicon dioxide layer 82. This oxide layer 82 is then etched away in the area of the transistor and not etched away in the area of the resistor prior to the second diffusion operation. The second diffusion operation is then accomplished by use of conventional diffusion techniques to provide the junction 36 between the emitter portion 38 and the base portion 40 of the transistor 30. The resistor 80 is masked from this diffusion by the silicon dioxide layer 82. Holes are then opened in the silicon dioxide layers 42 and 82 to provide openings for the appropriate ohmic contacts to be made to the silicon transistor device and silicon resistor device. The resistor electrical contacts 84 and 86, and the transistor contacts 50, 52 and 54 can then be applied simultaneously by conventional techniques.

Figure 6:
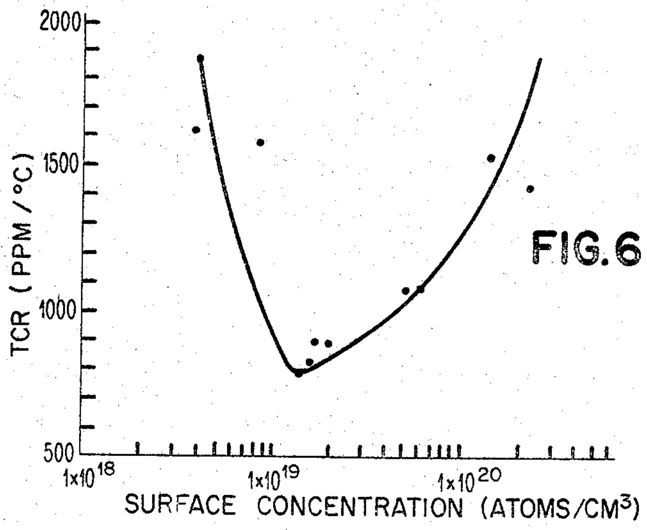
FIGURE 6 shows the temperature coefficient of resistance as a function of surface concentration for boron diffused resistors.

Temperature coefficient of resistance (TCR) of diffused resistors can be brought to a minimum value by the method of the present invention because TCR is a function of surface concentration of the diffused impurity. There is shown in FIGURE 6 a plot of the TCR versus surface concentration for boron diffused silicon resistors. The minimum value for the TCR is about 780 p.p.m./° C. for boron diffused resistors. The second diffusion step in the process of the present invention can be used to reduce the surface concentration of the diffused resistors and thus allows the fabricator the ability to obtain an optimum TCR for diffused silicon resistors by appropriately optimumizing the time and temperature of the second diffusion step and the mask opening width.

The following examples are included to merely aid in the understanding of the invention and variations may be made by one skilled in the art without departing from the spirit and scope of the invention.

EXAMPLE 1

Monocrystalline silicon was grown by the Czochralski method and were sliced parallel to the (111) growth direction, ground and polished to a thickness of 8 mils. The wafer provided had resistivities of 0.08 to 10 ohm-centimeters. The wafers were oxidized in steam at 1000° C. to produce a silicon dioxide surface on the wafer having a thickness of approximately 5000 angstroms. A series of elongated line openings of widths of 0.1 to 1.0 mil were opened to the silicon surface by means of conventional photoresist techniques and etching with hydrofluoric acid buffered with ammonium fluoride. An area of each wafer was completely stripped of silicon oxide by etching to simulate diffusion into a bulk wafer. The wafers were positioned in a sealed tube having an atmosphere controlled by a 7 to $8\times10^{20}$ centimeter$^{-3}$ boron source. Certain wafers were maintained in the boron atmosphere for 60 minutes, others for 120 minutes and still others for 220 minutes at a temperature of 1200° C. After the wafers were removed from the capsule the junction depth was determined by angle lapping to provide geometrical magnification of the vertical distances followed by a copper staining step to delineate the p-n junction. The horizontal distance on the bevel is then measured with a filar eyepiece through an optical microscope, the precise angle is measured with a goiniometer and the junction depth is calculated from the tangent function.

Figure 7:
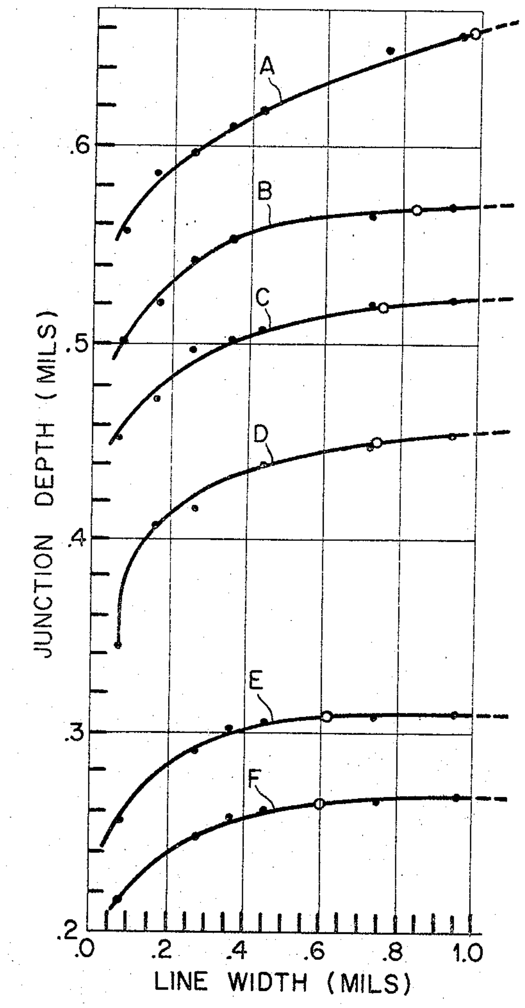
FIGURE 7 is a series of curves showing junction depth as a function of mask opening width.

The results are plotted in FIGURE 7 as junction depth against opening width. The following table gives information about the resistivities of the wafers and time each wafer is exposed to the diffusion source.

TABLE

| Curve | Resistivity (in ohm-cm.) | Time of exposure (in minutes) | Atom diffusion (in microns) | Length (L) (in mils) | Line width measured from Fig. 7 (at points A–F) (in mils) | Line width (in mils)= L (in mils) Multiple |
|---|---|---|---|---|---|---|
| A | 10.0 | 220 | 5.6 | 0.220 | 0.98 | 4.45 |
| B | 1.0 | 220 | 5.1 | 0.200 | 0.84 | 4.20 |
| C | 0.08 | 220 | 4.9 | 0.193 | 0.75 | 3.90 |
| D | 1.0 | 120 | 4.9 | 0.193 | 0.73 | 3.80 |
| E | 1.0 | 60 | 4.5 | 0.177 | 0.61 | 3.44 |
| F | 0.08 | 60 | 4.5 | 0.177 | 0.60 | 3.38 |

As can be seen from the FIGURE 7, the junction depth decreases with decreasing line width below the critical width. Above this width the junction depth was constant. This effect is more pronounced in high resistivity material. The 4.45 multiple was determined experimentally from the curves of FIGURE 7 using the formula:

$$C_x=C_0 \operatorname{erfc} \frac{X}{L}$$

where erfc=complementary error function
X=the junction depth

L=atom diffusion length (in microns)
$C_x$=concentration at any depth X
$C_0$=impurity atom concentration at X=0

The value X was taken from the curves A through F where each of the curves flattened out as indicated by the circle on each curve. A typical calculation follows for curve C.

$$C_x=C_0 \operatorname{erfc} \frac{X}{L}$$

$$C_x=1.2\times10^{17} \text{ atoms}-\text{cm}^{-3}$$

$$C_0=8\times10^{20} \text{ atoms}-\text{cm}^{-3}$$

$$X=.52 \text{ mils (from FIG. 7)}$$

$$\frac{C_x}{C_0}=1-\operatorname{erf} \frac{X}{L}$$

$$1-\frac{C_x}{C_0}=\operatorname{erf} \frac{X}{L}$$

$$1-\frac{1.2\times10^{17}}{8\times10^{20}}=\operatorname{erf} \frac{.52}{L}$$

$$0.999850=\operatorname{erf} \frac{.52}{L}$$

$$L=.194 \text{ mils or 4.9 microns}$$

Line width (mils) from FIG. 7 is 0.75;

$$\frac{0.75}{0.194}=3.9 \text{ (the multiple)}$$

EXAMPLE 2

Figure 8:
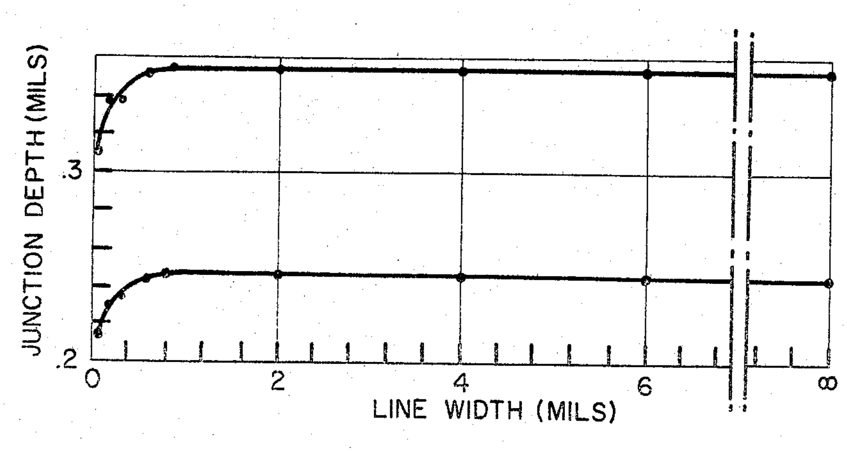
FIGURE 8 is a graphical illustration of junction depth as a function of mask opening width for two different concentrations of impurities.

Boron diffusions were made through openings in the silicon dioxide masked silicon wafers according to the procedure of Example 1 at concentrations of $7.0\times10^{19}$ cm.$^{-3}$ and $1.6\times10^{18}$ cm.$^{-3}$. The diffusion conditions in each case were 1200° C. for four hours. The results are plotted in FIGURE 8 as junction depth versus line width opening in the mask. The effect of opening line width on junction depth is still very noticeable. Thus, it is apparent that junction depth becomes a variable dependent upon mask opening line width at very small mask opening line widths without regard to the concentration of dopant used.

Other dopants, such as phosphorus, arsenic, antimony, aluminum, gallium and indium will perform in a similar manner to boron which was used in the above examples. The critical mask opening of about 4.45 multiples remains substantially the same for these dopants. This is true because the diffusion effect is dependent on geometrical considerations independent of the diffusing specie. Further, semiconductor materials other than silicon, such as germanium or gallium arsenide, will obviously be useful in the present method of the invention because the effect is common to all materials.

While the invention has been particularly shown described with reference to a preferred embodiment thereof, it will be understood by those skilled in the art that various changes in form and details may be made therein without departing from the spirit and scope of the invention.

What is claimed is:

1. In a method of forming high speed transistors in a semiconductor substrate comprising:

providing a mask in contact with the surface of a semiconductor substrate;

said mask having at least one opening of a width that is less than about 4.45 multiples of an atom diffusion length of the conductivity type determining impurity to be subsequently diffused through said mask;

exposing said substrate through said opening in said mask to an environment containing said conductivity type determining impurity under conditions for diffusion of said conductivity type determining impurity into said substrate;

heating said substrate to further diffuse the said impurity within said substrate in an environment which contains a concentration of impurity lower than necessary to produce the substrate surface impurity concentration and cause a nonuniform impurity surface concentration on that portion of said substrate exposed to said impurity through said mask;

forming an emitter-base junction by diffusing the appropriate conductivity type determining impurity through said opening; and applying electrical contacts to the structural elements of said transistor formed in said substrate.

2. In the method of forming high speed transistors of claim 1 wherein the said impurity is boron.

3. In the method of forming high speed transistors of claim 2 wherein said substrate is monocrstalline silicon.

4. In the method for simultaneously forming a high speed bipolar transistor device and a second type of circuit device in a semiconductor substrate comprising:

providing a mask in contact with the surface of a semiconductor substrate;

said mask having at least one opening of a width that is less than about 4.45 multiples of an atom diffusion length of the conductivity type determining impurity to be subsequently diffused through said mask;

said mask also having at least one opening of a width that is greater than about 4.45 multiples of an atom diffusion length of the conductivity type determining impurity to be subsequently diffused through said mask;

exposing said substrate through said openings in said mask to an environment containing said conductivity type determining impurity under conditions for diffusion of said conductivity type determining impurity into said substrate to cause different diffusion depths in said semiconductor at the said opening of width less than about 4.45 multiple and said opening of width greater than about 4.45 multiples; and heating said substrate to further diffuse the said impurity within said substrate in an environment which contains a concentration of impurity lower than necessary to produce the substrate surface impurity concentration and cause a nonuniform impurity surface concentration on that portion of said substrate exposed to said impurity through said mask opening of less than said 5.6 multiple forming an emitter-base junction by diffusing the appropriate conductivity through said opening of width less than about 4.45 multiples.

5. In the method for simultaneously forming devices of claim 4 wherein the heating of said substrate to further diffuse said impurity is in a non-oxidizing atmosphere.

6. In the method for simultaneously forming devices of claim 4 wherein the heating of said substrate to further diffuse said impurity is in an oxidizing atmosphere to cause a semiconductor oxide to form on the exposed surface of said semiconductor substrate.

7. In the method of claim 4 for simultaneously forming a high speed transistor and a second type of circuit device wherein the said second device is a resistor having optimum TCR characteristics; and the size of the said mask opening is greater than about 4.45 multiples being of a width so as to produce the optimum surface concentration for the resistor TCR characteristic after said heating of said substrate to further diffuse the said impurity within said substrate.

8. In the method of claim 4 for simultaneously forming a high speed transistor and a second type of circuit device wherein the said second device is a slower speed transistor; and applying electrical contacts to the structural elements of the transistors formed in said substrate.

9. The semiconductor product fabricated by the method of claim 4.

10. The semiconductor product fabricated by the method of claim 1.

References Cited

UNITED STATES PATENTS

| | | | |
|---|---|---|---|
| 2,873,222 | 2/1959 | Derick et al. | 148—187 X |
| 2,981,645 | 4/1961 | Tucker | 148—189 X |
| 2,981,877 | 4/1961 | Noyce. | |
| 3,006,789 | 10/1961 | Nijland | 148—190 X |
| 3,025,589 | 3/1962 | Hoerni | 29—578 X |
| 3,165,430 | 1/1965 | Hugle | 148—187 |
| 3,246,214 | 4/1966 | Hugle | 148—187 X |
| 2,802,760 | 8/1957 | Derick | 148—190 |

L. DEWAYNE RUTLEDGE, Primary Examiner

R. A. LESTER, Assistant Examiner

U.S. Cl. X.R.

29—578; 148—189